US012652037B2

(12) United States Patent

Maes

(10) Patent No.: US 12,652,037 B2

(45) Date of Patent: Jun. 9, 2026

(54) BATTERY MANAGEMENT SYSTEM EQUIPPED WITH PARKING TO PREVENT PARASITIC LEAKAGE

(71) Applicant: KeyTek Semiconductor HongKong Limited, Hong Kong (HK)

(72) Inventor: David Maes, Cupertino, CA (US)

(73) Assignee: KeyTek Semiconductor HongKong Limited, WanChai (HK)

( * ) Notice: Subject to any disclaimer, the term of this patent is extended or adjusted under 35 U.S.C. 154(b) by 185 days.

(21) Appl. No.: 18/594,748

(22) Filed: Mar. 4, 2024

(65) Prior Publication Data

US 2025/0279779 A1 Sep. 4, 2025

(51) Int. Cl.
H03K 17/10 (2006.01)
H02J 7/50 (2026.01)
H03K 19/173 (2006.01)

(52) U.S. Cl.
CPC .............. H03K 17/102 (2013.01); H02J 7/50 (2026.01); H03K 19/1737 (2013.01)

(58) Field of Classification Search
CPC .. H03K 17/102; H03K 19/1737; H02J 7/0013
USPC ......................................................... 327/436
See application file for complete search history.

(56) References Cited

U.S. PATENT DOCUMENTS

2012/0056661 A1* 3/2012 Shabra ................. H03K 17/693
327/436

* cited by examiner

*Primary Examiner* — Tomi Skibinski

(74) *Attorney, Agent, or Firm* — David R. Stevens; Stevens Law Group

(57) ABSTRACT

Systems and methods for reducing parasitic current leakage. A switch includes a source resistor, a first transistor, a second transistor, and a midpoint transistor. The midpoint transistor is located in between the first transistor and the second transistor. The midpoint transistor is maintained at a low voltage in response to the switch being in a non-conductive state, and the low voltage is less than or equal to an output voltage of the switch.

21 Claims, 9 Drawing Sheets

500

| Sub | Source/Body | Gate | Drain/N-iso |
|-----|-------------|------|-------------|
| 502 | 504 | 506 | 508 |

P+

P+ | N+

N+

N+

P-Well 510

N-iso Well 512

P-Sub 514

600

700

900

BATTERY MANAGEMENT SYSTEM EQUIPPED WITH PARKING TO PREVENT PARASITIC LEAKAGE

TECHNICAL FIELD

The disclosure relates to battery management systems and specifically relates to systems and methods for preventing leakage in battery management systems.

BACKGROUND

Battery management systems (BMS) are designed to monitor, protect, and manage the performance of batteries. Battery management systems may specifically be used in electric vehicles, portable electronic devices, renewable energy systems, and so forth.

Current leakage in battery management systems can be a concern in situations wherein the battery management system is expected to monitor and manage the state of rechargeable batteries. Excessive current leakage can lead to several issues, including reduced battery life, inefficient energy usage, and potential safety hazards. Battery management systems are typically designed to operate with minimal power consumption, especially in low-power modes when the device is not actively using the battery. However, some low-level current leakage is common due to the intrinsic properties of components of the battery management system, and further due to power requirements.

In some cases, a battery management system includes a parasitic BJT (bipolar junction transistor). High-voltage NMOS (N-channel metal-oxide semiconductor) transistors typically have a drain connected to an isolating N-iso well. In some cases, there is a parasitic PNP (positive-negative-positive) transistor formed in the body of the NMOS transistor. This parasitic PNP transistor can cause current leakage that reduces performance of the battery management system and the connected batteries.

Considering the foregoing, disclosed herein are systems, methods, and devices for improved battery management that prevent current leakage.

BRIEF DESCRIPTION OF THE DRAWINGS

Non-limiting and non-exhaustive implementations of the disclosure are described with reference to the following figures, wherein like reference numerals refer to like parts throughout the various views unless otherwise specified. Advantages of the disclosure will become better understood regarding the following description and accompanying drawings where.

DETAILED DESCRIPTION

Figure 1:
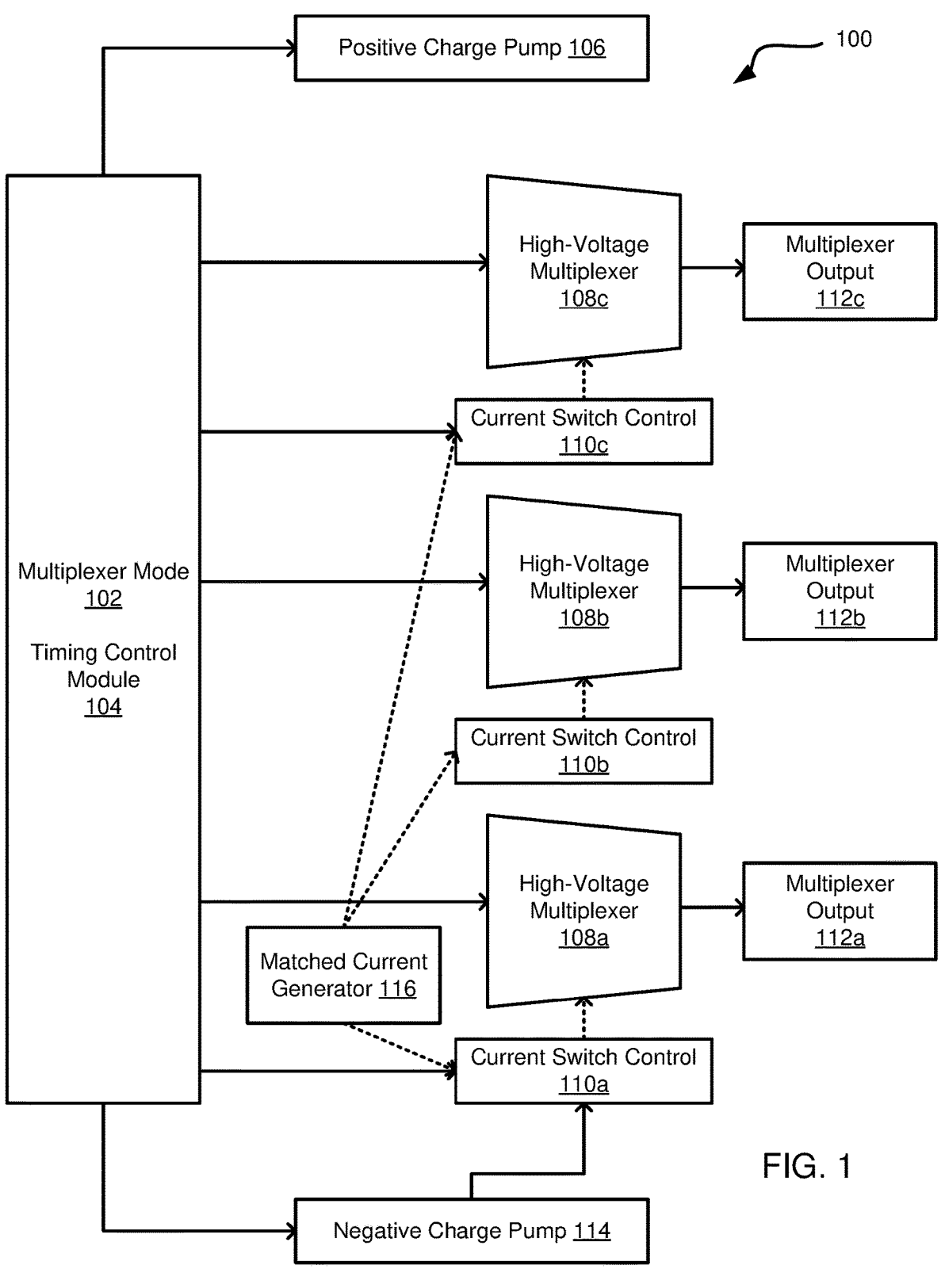
FIG. 1 is a schematic block diagram illustrating some components of a system for battery management.

Described herein are systems, methods, and devices for battery management. The battery management systems and devices described herein are configured to measure a stack of batteries and connect battery inputs into one or more analog-to-digital converters (ADCs). Specifically described herein are battery management systems and devices capable of executing a parking function to reduce current leakage.

The battery management systems described herein may be implemented with asymmetric high-voltage MOSFETs (metal oxide semiconductor field-effect transistors). High-voltage MOSFETs are a type of power electronic device designed to handle high voltage levels in various applications. MOSFETs are used in electronic circuits to control the flow of current, and high-voltage MOSFETs are specifically engineered to operate at elevated voltage levels. High-voltage MOSFETs are optimized for low on-resistance, which helps minimize power losses and heat generation when the transistor is conducting current. Lower on-resistance values can be important for efficient high-voltage applications. High-voltage MOSFETs are useful in various fields, including power electronics, automotive systems (e.g., electric vehicles and battery management), renewable energy systems (e.g., solar inverters), and industrial control systems.

The battery management systems described herein may further be implemented with a high-voltage DMOS (double diffused metal oxide semiconductor). High-voltage DMOS transistors are a type of power semiconductor that combines the advantages of DMOS technology with the capability to handle high voltage levels. High-voltage DMOS may be implemented in various applications where high-voltage switching, or amplification is required. High-voltage DMOS devices are designed to operate at elevated voltage levels and are optimized for low on-resistance. This helps minimize power losses and improves efficiency in high-voltage applications. High-voltage DMOS transistors often require a higher gate-source voltage to turn on when compared to lower voltage MOSFETs. Adequate gate driver circuits may be employed to provide the necessary voltage and current for proper switching.

The battery management systems described herein may further be implemented with an NMOS (N-channel metal-oxide semiconductor) transistor. The NMOS transistor is a type of field-effect transistor (FET) used in electronic circuits, and especially in digital integrated circuits. NMOS transistors are capable of controlling the flow of current between two terminals, which are referred to as the source terminal and the drain terminal. The NMOS utilizes a third terminal, referred to as the gate terminal, to control the flow of current between the source terminal and the drain terminal. NMOS transistors apply a voltage to the gate terminal, and when a positive voltage is applied to the gate terminal relative to the source terminal, the NMOS transistor creates an electric field in the channel region beneath the gate terminal. This electric field attracts electrons from the source terminal to form a conductive channel between the source terminal and the drain terminal. NMOS transistors are normally off (i.e., non-conductive) until a gate-source voltage is applied to turn them on. The gate source voltage is typically positive relative to the source terminal to create the electric field needed for conduction. When an NMOS transistor is in the on state (i.e., conductive), electrons flow from the source terminal to the drain terminal. In digital circuits, NMOS transistors are often utilized to implement logic states. By connecting multiple NMOS transistors in various configurations, logic functions can be created.

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure claimed.

Before the structure, systems, and methods described herein are disclosed and described, it is to be understood that this disclosure is not limited to the particular structures, configurations, process steps, and materials disclosed herein as such structures, configurations, process steps, and materials may vary somewhat. It is also to be understood that the terminology employed herein is used for the purpose of describing particular embodiments only and is not intended to be limiting since the scope of the disclosure will be limited only by the appended claims and equivalents thereof.

In describing and claiming the subject matter of the disclosure, the following terminology will be used in accordance with the definitions set out below.

It must be noted that, as used in this specification and the appended claims, the singular forms "a," "an," and "the" include plural referents unless the context clearly dictates otherwise.

As used herein, the terms "comprising," "including," "containing," "characterized by," and grammatical equivalents thereof are inclusive or open-ended terms that do not exclude additional, unrecited elements or method steps.

As used herein, the phrase "consisting of" and grammatical equivalents thereof exclude any element or step not specified in the claim.

As used herein, the phrase "consisting essentially of" and grammatical equivalents thereof limit the scope of a claim to the specified materials or steps and those that do not materially affect the basic and novel characteristic or characteristics of the claimed disclosure.

Referring now to the figures, FIG. 1 is a schematic block diagram illustrating some components of a system 100 for battery management. The system 100 specifically illustrates a multiplexer (may be abbreviated "MUX" as described herein), which is a digital electronic device, analog device, or a combinational logic circuit that serves as a data selector. The system 100 allows multiple input data lines to be routed to a single output line. The system 100 may be implemented in a digital electronics device and may be utilized for data routing, signal selection, and control.

The system 100 includes a multiplexer mode module 102 and a timing control module 104, which may collectively be referred to herein as the control modules 102, 104. The system 100 further includes a positive charge pump 106 and a negative charge pump 114. The control modules 102, 104 are in electronic communication with each of the positive charge pump 106 and the negative charge pump 114.

The system 100 includes three sets of high-voltage multiplexers and current switch controls. Specifically, the system 100 includes a first current switch control 110a in electrical communication with a first high-voltage multiplexer 108c. The system 100 includes a second current switch control 110b in electrical communication with a second high-voltage multiplexer 108b. The system 100 includes a third current switch control 110c in electrical communication with a third high-voltage multiplexer 108c. The first high-voltage multiplexer 108c outputs a first multiplexer output 112a; the second high-voltage multiplexer 108b outputs a second multiplexer output 112b; and the third high-voltage multiplexer 108c outputs a third multiplexer output 112c. The system 100 additionally includes a matched current generator 116 that is in electrical communication with each of the first current switch control 110a, the second current switch control 110b, and the third current switch control 110c.

The system 100 may be altered depending on the desired implementation. Specifically, the quantity of high-voltage multiplexers 108a-108c may be adjusted depending on the desired implementation. In a specific use-case described herein, the system 100 is utilized as a component of a battery management system that controls numerous battery cell inputs. However, the components of the system 100 and the architecture of the system 100 may be implemented in other use-cases not involving battery management.

The example system 100 illustrated in FIG. 1 may be implemented in a battery management system that includes eighteen battery cell inputs, or another quantity of battery cell inputs that is divisible by the quantity of high-voltage multiplexers 108a-108c. In an alternative implementation, system 100 is implemented in a battery management system, and the quantity of battery cell inputs is not divisible by the quantity of high-voltage multiplexers 108a-108c. Depending on the use-case, it is not required that each high-voltage multiplexer 108a-108c has the same number of inputs.

The system 100 is configured to take the battery cell inputs, general purpose input/output (GPIO) signals, and sensor signals, and then multiplex those signals to three different analog-to-digital converters (ADCs). The quantity of ADCs may correspond with the quantity of high-voltage multiplexers 108a-108c, and thus, the quantity of ADCs may be adjusted if the system 100 is altered to include a different number of high-voltage multiplexers 108a-108c than shown in the example of FIG. 1.

The system 100 is divided across the three high-voltage multiplexers 108a-108c, which select from the battery cells in groups of six. Thus, each of the three high-voltage multiplexers 108a-108c is assigned to six of the 18 battery cells. The high-voltage multiplexers 108a-108c connect the battery cells to three ADCs. In some implementations, the high-voltage multiplexers 108a-108c may additionally connect to a low-voltage multiplexer (not shown in FIG. 1) that is configured to select from the GPIO signals and various sensor signals. Each of the multiplexers in the system 100 is differential. The high-voltage multiplexers 108a-108c switch the top and bottom of the selected battery cells to their outputs. The auxiliary multiplexer switches a GPIO signal or a sensor signal to its positive output, the ground (if a GPIO is selected), or the appropriate ground sense (if a sensor is selected).

The switches (not shown in FIG. 1) float the various battery cell inputs but may be configured to tolerate only 6 V maximum across their gate oxides. The switches may be turned on by sending a current through a resistor connected from gate to source. At the same time, an identical current may be sunk from the source of the switch, such that the net current flowing through the switch and back to the battery cell input is minimized to the extent possible given the accuracy of the matching of the source and sink currents.

The currents passing through the system 100 are generated by an amplifier that forces a fraction of a regulated 5 Volt input across a replica resistor. Multiple matched copies of the current through that resistor may be mirrored for the source and sink currents of the enabled switches. The gate/source resistors are the same type and may have the same width and segment length as the replica resistor. This ensures the process and temperature variation of the resistance is nominally cancelled, and the gate-source voltage (Vgs) of the switches is a function of the regulated 5 Volt input.

The current switch controls 110a-110c are configured to switch the currents from the matched current source array to the enabled switches. In some cases, the system 100 may be controlled with a 5 V logic block that generates all individual controls for each of the high-voltage multiplexers 108a-108c and current sources.

The system 100 includes the positive charge pump 106 and the negative charge pump 114. The negative charge pump 114 may specifically include a negative inverting doubler charge pump that is configured to create a nominal −5 V to serve as the negative rail for the current sources that sink current from the lowest switch, whose channel voltage may be at or near ground. The positive charge pump 106 may specifically include a positive tripler charge pump that is configured to create a nominal positive supply voltage ("VDD") +10 V to serve as the positive rail for the current sources that source current for a subset of switches whose channels are at or near the positive supply voltage. In an alternative implementation, the positive charge pump 106 includes a positive doubler charge pump.

Figure 2A:
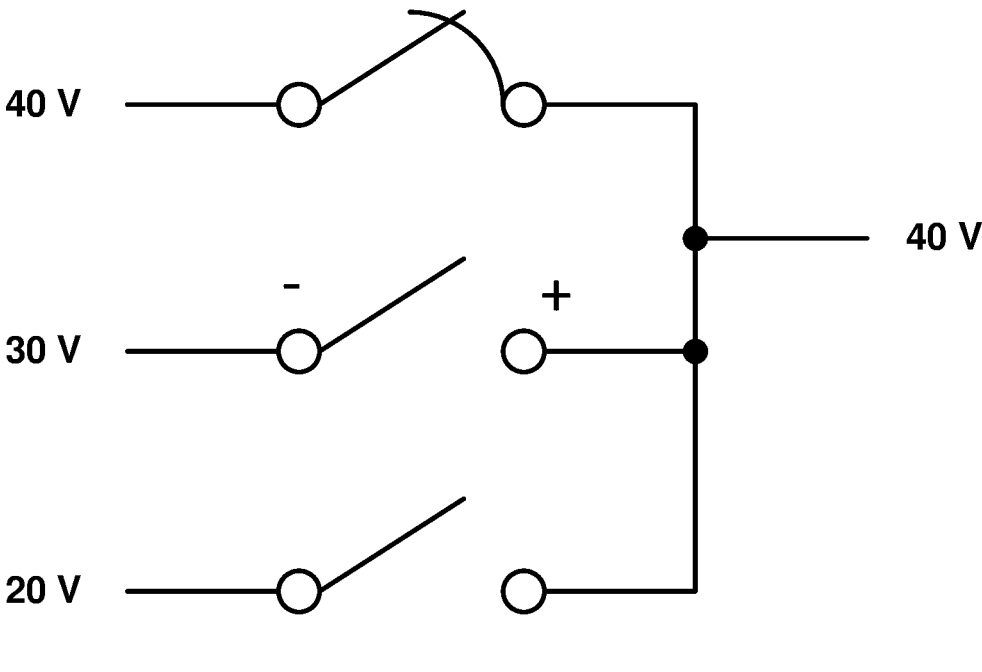
FIG. 2A is a schematic circuit diagram illustrating a simplified portion of a multiplexer with three switches.
Figure 2B:
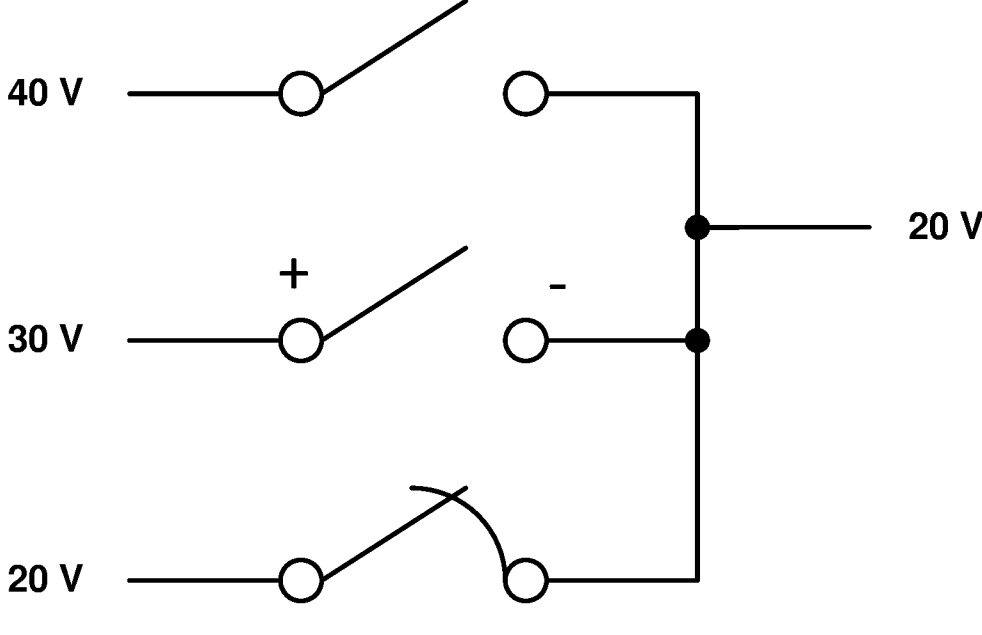
FIG. 2B is a schematic circuit diagram illustrating a simplified portion of a multiplexer with three switches.

FIGS. 2A and 2B are schematic circuit diagrams each illustrating a simplified portion of a multiplexer with three inputs. Each of the multiplexers includes three inputs, including a 40 V input, a 30 V input, and a 20 V input. The multiplexers illustrated in FIGS. 2A and 2B are implemented with different configurations.

In FIG. 2A, a top switch of the multiplexer is switched into the "on" position such that the multiplexer outputs 40 V. In FIG. 2B, the bottom switch of the multiplexer is switched into the "on" position such that the multiplexer outputs 20 V. In both cases, the center switch, which is connected to a 30 V input, is in the "off" position. In FIG. 2A, there is a negative voltage across the center switch from the input to the output. By contrast, in FIG. 2B, there is a positive voltage across the center switch from the input to the output. Because a single high-voltage transistor can only withstand a large positive voltage in one direction, each switch is made of two series MOSFETs in opposite directions. In this implementation, a MOSFET withstands the voltage in the configuration of FIG. 2A, and another MOSFET withstands the voltage in the configuration of FIG. 2B.

The switch configurations illustrated in FIGS. 2A and 2B may be implemented in the system 100 illustrated in FIG. 1.

The multiplexer illustrated in FIG. 2A includes three switches, including a top switch with a 40 V input, a center switch with a 30 V input, and a bottom switch with the 20 V input. Each of these three switches has the same 40 V output. The multiplexer illustrated in FIG. 2B similarly includes three switches, including a top switch with a 40 V input, a center switch with a 30 V input, and a bottom switch with a 20 V input. Each of these three switches has the same 20 V output.

Figure 3:
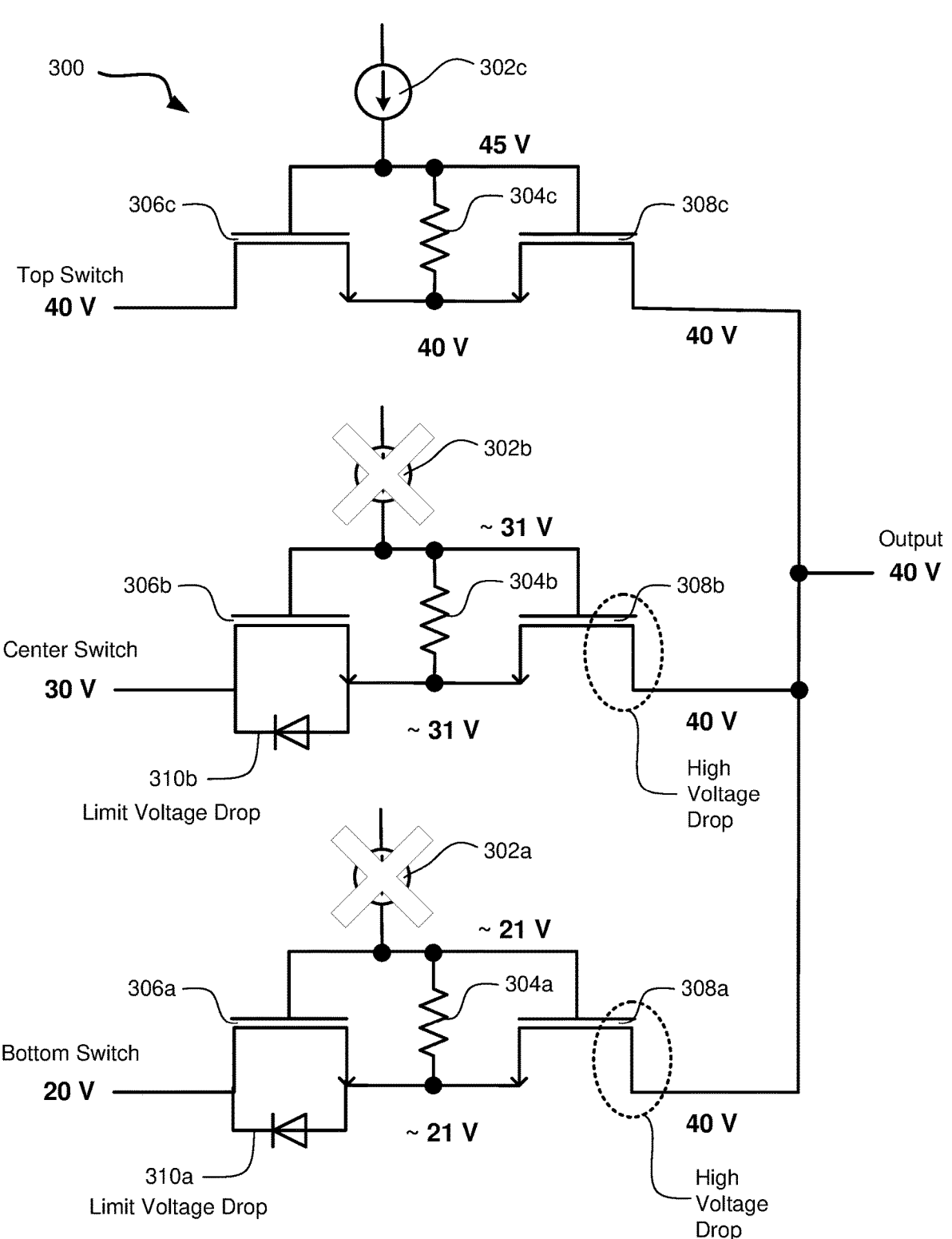
FIG. 3 is a schematic circuit diagram of a multiplexer that includes three switches, wherein each of the three switches includes dual series MOSFET implementation.
Figure 4:
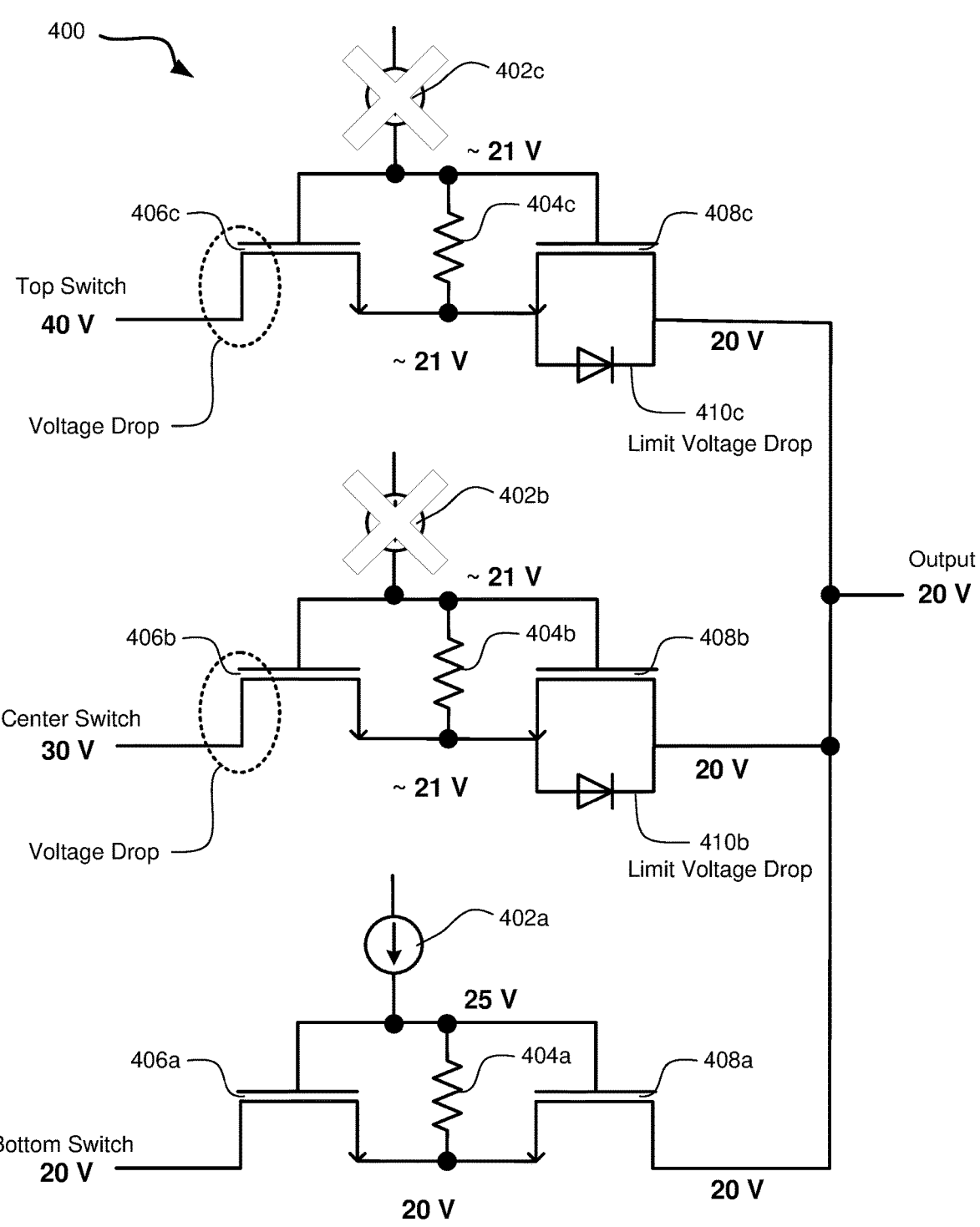
FIG. 4 is a schematic circuit diagram of a multiplexer that includes three switches, wherein each of the three switches includes dual series MOSFET implementation.

FIGS. 3 and 4 are schematic circuit diagrams each illustrating variations on the same circuits illustrated in FIGS. 2A and 2B, but with dual NMOS (N-channel metal oxide semiconductor) transistors. Specifically, the multiplexer 300 illustrated in FIG. 3 corresponds with the multiplexer arrangement illustrated in FIG. 2A. Further, the multiplexer 400 illustrated in FIG. 4 corresponds with the multiplexer arrangement illustrated in FIG. 2B.

FIG. 3 is a schematic circuit diagram of a multiplexer 300 comprising three inputs, including a top switch that inputs 40 V, a center switch that inputs 30 V, and a bottom switch that inputs 20 V. The multiplexer 300 outputs 40 V. The multiplexer 300 includes a dual series NMOS implementation, wherein each input feeds into dual NMOS transistors.

The multiplexer 300 includes two switches experiencing a high voltage drop. In this case, the high voltage drain-to-source voltage is higher than a maximum allowed gate-to-source voltage. It is not necessary that the multiplexer 300 actually withstands high voltage, even though the multiplexer 300 is designed to withstand a high voltage drop.

The multiplexer 300 includes a gate associated with each input. The bottom switch (i.e., the 20 V input) is associated with a first gate 302a. The center switch (i.e., the 30 V input) is associated with a second gate 302b. The top switch (i.e., the 40 V input) is associated with a third gate 302c. Additionally, the multiplexer 300 includes a first source resistor 304a in electrical communication with the first gate 302a; a second source resistor 304b in electrical communication with the second gate 302b; and a third source resistor 304c in electrical communication with the third gate 302c.

The multiplexer 300 includes a pair of NMOS transistors for each input. The bottom switch includes a first left NMOS transistor 306a and a first right NMOS transistor 308a. The center switch includes a second left NMOS transistor 306b and a second right NMOS transistor 308b. The top switch includes a third left NMOS transistor 306c and a third right NMOS transistor 308c.

As shown in FIG. 3, the third gate 302c (i.e., the one in electrical communication with the top switch) is switched on such that current flows through the third gate 302c. Thus, a current flows through the third gate 302c and the third source resistor 304c. In the configuration illustrated in FIG. 3, this current flowing through the third gate 302c and the third source resistor 304c has a gate source voltage (Vgs) of 5 V. Further as shown in FIG. 3, the currents driving the middle grouping of transistors (i.e., the second left NMOS transistor 306b and the second right NMOS transistor 308b) and the bottom grouping of transistors (i.e., the first left NMOS transistor 306a and the first right NMOS transistor 308a) are switched off. Thus, the gate source voltages for the middle grouping and the bottom grouping are equal to zero volts.

Further as shown in FIG. 3, the second left NMOS transistor 306b includes a second parasitic drain/body diode 310b. Additionally, the first left NMOS transistor 306a includes a first parasitic drain/body diode 310a. The parasitic drain/body diodes 310b, 310a turn on to limit the reverse voltage drop to within one volt. The high voltage is dropped across the drains of the rightmost transistors with proper polarity. Thus, the second parasitic drain/body diode 310*b* turns on to limit reverse voltage drop, and the high voltage instead drops across the drain of the second right NMOS transistor 308*b*. Likewise, the first parasitic drain/body diode 310*a* turns on to limit reverse voltage drop, and the high voltage instead drops across the drain of the first right NMOS transistor 308*a*. In FIG. 3, the high voltage drops across the rightmost NMOS transistors are encircled.

Like the multiplexer 300 illustrated in FIG. 3, FIG. 4 is a schematic circuit diagram of a multiplexer 400 comprising three inputs, including a top switch that inputs 40 V, a center switch that inputs 30 V, and a bottom switch that inputs 20 V. The multiplexer 400 outputs 20 V. The multiplexer 400 includes a dual series NMOS implementation, wherein each input feeds into dual NMOS transistors.

The multiplexer 400 illustrated in FIG. 4 represents the reverse of the multiplexer 300 illustrated in FIG. 3. Specifically, in FIG. 4, the transistor pair in the bottom grouping is on, and the transistor pairs in the middle grouping and the top grouping are off. The multiplexer 400 switches are configured to withstand a high voltage with the opposite polarity when compared with the multiplexer 300 illustrated in FIG. 3.

Like the multiplexer 300 illustrated in FIG. 3, the multiplexer 400 includes a gate associated with each input. The bottom switch (i.e., the 20 V input) is associated with a first gate 402*a*. The center switch (i.e., the 30 V input) is associated with a second gate 402*b*. The top switch (i.e., the 40 V input) is associated with a third gate 402*c*. Additionally, the multiplexer 400 includes a first source resistor 404*a* in electrical communication with the first gate 402*a*; a second source resistor 404*b* in electrical communication with the second gate 402*b*; and a third source resistor 404*c* in electrical communication with the third gate 402*c*.

The multiplexer 400 includes a pair of NMOS transistors for each input. The bottom switch is in electrical communication with a first left NMOS transistor 406*a* and a first right NMOS transistor 408*a*. The center switch is in electrical communication with a second left NMOS transistor 406*b* and a second right NMOS transistor 408*b*. The top switch is in electrical communication with a third left NMOS transistor 406*c* and a third right NMOS transistor 408*c*.

As shown in FIG. 4, the first gate 402*a* (i.e., the one in electrical communication with the bottom switch) is switched on such that current flows through the first gate 402*a*. Thus, a current flows through the first gate 402*a* and the first source resistor 404*a*. In the configuration illustrated in FIG. 4, this current flowing through the third gate 402*a* and the third source resistor 404*a* has a gate source voltage (Vgs) of 5 V. Further as shown in FIG. 4, the currents driving the middle grouping of transistors (i.e., the second left NMOS transistor 406*b* and the second right NMOS transistor 408*b*) and the top grouping of transistors (i.e., the third left NMOS transistor 406*c* and the third right NMOS transistor 408*c*) are switched off. Thus, the gate source voltages for the middle grouping and the bottom grouping are equal to zero volts.

Further as shown in FIG. 4, the second right NMOS transistor 408*b* includes a second parasitic drain/body diode 410*b*. Additionally, the third right NMOS transistor 408*c* includes a third parasitic drain/body diode 410*c*. Notably, the location of the parasitic drain/body diodes are reversed in the multiplexer 400 when compared against the multiplexer 300 discussed in connection with FIG. 3. The parasitic drain/body diodes 410*b*, 410*c* turn on to limit the reverse voltage drop to within one volt. Thus, in contrast with the multiplexer 300 discussed in connection with FIG. 3, the high voltage is dropped across the drains of the leftmost transistors with proper polarity. Thus, the second parasitic drain/body diode 410*b* turns on to limit reverse voltage drop, and the high voltage instead drops across the drain of the second left NMOS transistor 406*b*. Likewise, the third parasitic drain/body diode 410*c* turns on to limit reverse voltage drop, and the high voltage instead drops across the drain of the third left NMOS transistor 406*c*. In FIG. 4, the high voltage drops across the leftmost NMOS transistors are encircled.

FIGS. 3 and 4 represent multiplexers 300, 400 with opposite polarity. In FIG. 4, the switches of the multiplexer 400 must withstand a high voltage with the opposite polarity when compared with the multiplexer 300 illustrated in FIG. 3.

Figure 5:
FIG. 5 is a schematic cross-sectional diagram of an NMOS transistor that includes a drain connected to an isolating N-iso well.

FIG. 5 is a schematic cross-sectional diagram of an NMOS transistor 500 that includes a drain connected to an isolating N-iso well. The high-voltage NMOS transistors have the drain connected to the isolating N-iso well, and there is a parasitic PNP (positive-negative-positive) transistor formed by the body/N-iso/sub, which turns on when the drain/N-iso voltage drops low enough below the source/body voltage. The NMOS transistor 500 illustrated in FIG. 5 may serve as an electronically controlled switch that allows or blocks the flow of current between its source and drain terminal based on voltage applied to its gate terminal.

The NMOS transistor 500 includes a sub terminal 502, a source/body terminal 504, a gate terminal 506, and a drain/N-iso terminal 508. The gate terminal 506 controls the flow of current between the source/body terminal 504 and the drain/No-iso terminal 508. When a voltage is applied to the gate terminal 506 relative to the source/body terminal 504, this creates an electric field that either allows or restricts the flow of charge carriers in the channel. The source/body terminal 504 is the connection point through which electrons enter the channel. It is typically connected to the lower voltage in an analog circuit, with the source and drain configured at the same voltage. The drain/N-iso terminal 508 is the connection point through which electrons exit the channel. It is typically connected to a higher voltage relative to the source/body terminal 504. When used as a switch, the source/body terminal 504 and the drain/N-iso terminal 508 may be at the same voltage.

The NMOS transistor 500 further includes a p-well 510 and a p-sub 514, and additionally includes an N-iso well 512 disposed in between the p-well 510 and the p-sub 514. The N-iso well 512 is an isolated region within the silicon substrate, and it is infused with n-type impurities. The n-type N-iso well 512 is isolated from the surrounding p-type substrates (i.e., the p-well 510 and the p-sub 514). The N-iso well 512 provides electrical isolation between different components, such as n-type and p-type transistors, within the same integrated circuit. This isolation prevents leakage currents and crosstalk between these components.

When a positive voltage (higher than a certain threshold voltage) is applied to the gate terminal 506 relative to the source/body terminal 504, an electric field is generated in the channel region beneath the gate terminal 506. This electric field attracts electrons from the source/body terminal 504 region into the channel, creating a conductive path between the source/body terminal 504 and the drain/N-iso terminal 508. When the NMOS transistor 500 is in the "on" state (i.e., conducting), current can flow from the source/body terminal 504 to the drain/N-iso terminal 508. This allows for the desired signal processing, switching, or amplification. When the gate terminal 506 voltage and the source/body terminal 504 voltage are below the threshold voltage, the NMOS transistor 500 is in the "off" state (i.e., non-conducting), and negligible current flows between the source/body terminal 504 and the drain/N-iso terminal 508.

Figure 6:
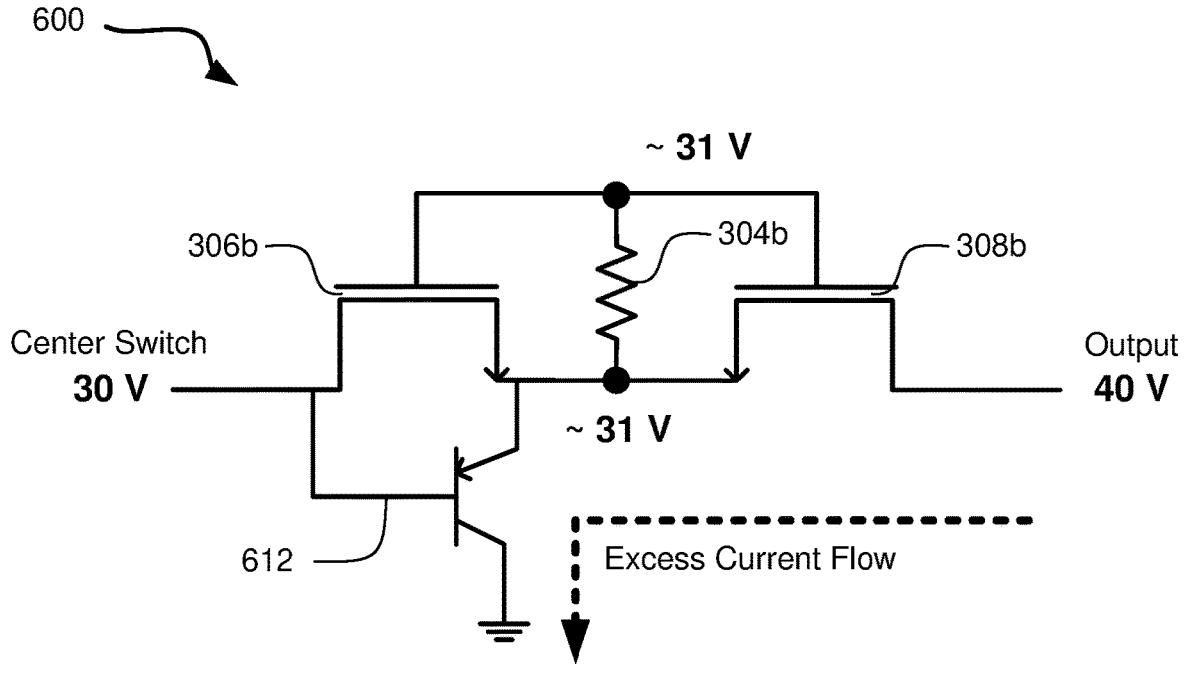
FIG. 6 is a schematic circuit diagram of a switch that includes a dual series MOSFET implementation with a parasitic PNP (positive-negative-positive) transistor.
Figure 7:
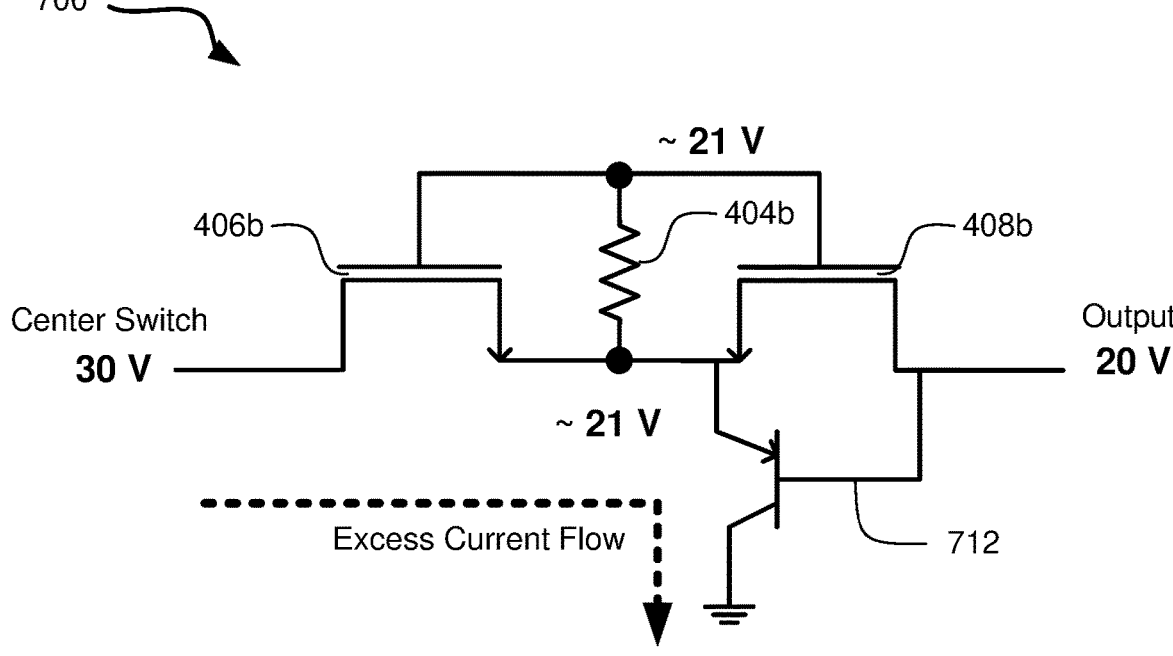
FIG. 7 is a schematic circuit diagram of a switch that includes a dual series MOSFET implementation with a parasitic PNP (positive-negative-positive) transistor.

FIGS. 6 and 7 are schematic circuit diagrams each illustrating variations on the same multiplexers 300, 400 illustrated in FIGS. 3 and 4, but with parasitic PNP (positive-negative-positive) transistors included. Specifically, FIG. 6 illustrates a center switch 600 that corresponds with the center switch of the multiplexer 300 illustrated in FIG. 3. FIG. 7 illustrates a center switch 700 that corresponds with the center switch of the multiplexer 400 illustrated in FIG. 4. In both configurations, the reverse biasing of the lower-voltage FET turns on the source/body to drain/N-iso junction. Excess current flows as shown by the arrows.

In FIG. 6, the center switch 600 includes the second source resistor 304b, the second left NMOS transistor 306b, the second right NMOS transistor 308b, and a parasitic PNP transistor 612. In FIG. 7, the center switch 700 includes the second source resistor 404b, the second left NMOS transistor 406b, the second right NMOS transistor 408b, and a parasitic PNP transistor 712. In both center switches 600, 700, the reverse biasing of the lower-voltage FET turns on the source/body to drain/N-iso junction. This causes excess current to flow as shown in FIGS. 6 and 7.

Figure 8:
FIG. 8 is a schematic circuit diagram of a switch that includes a plurality of transistors configured to implement transistor voltage parking to reduce current leakage.
Figure 8:
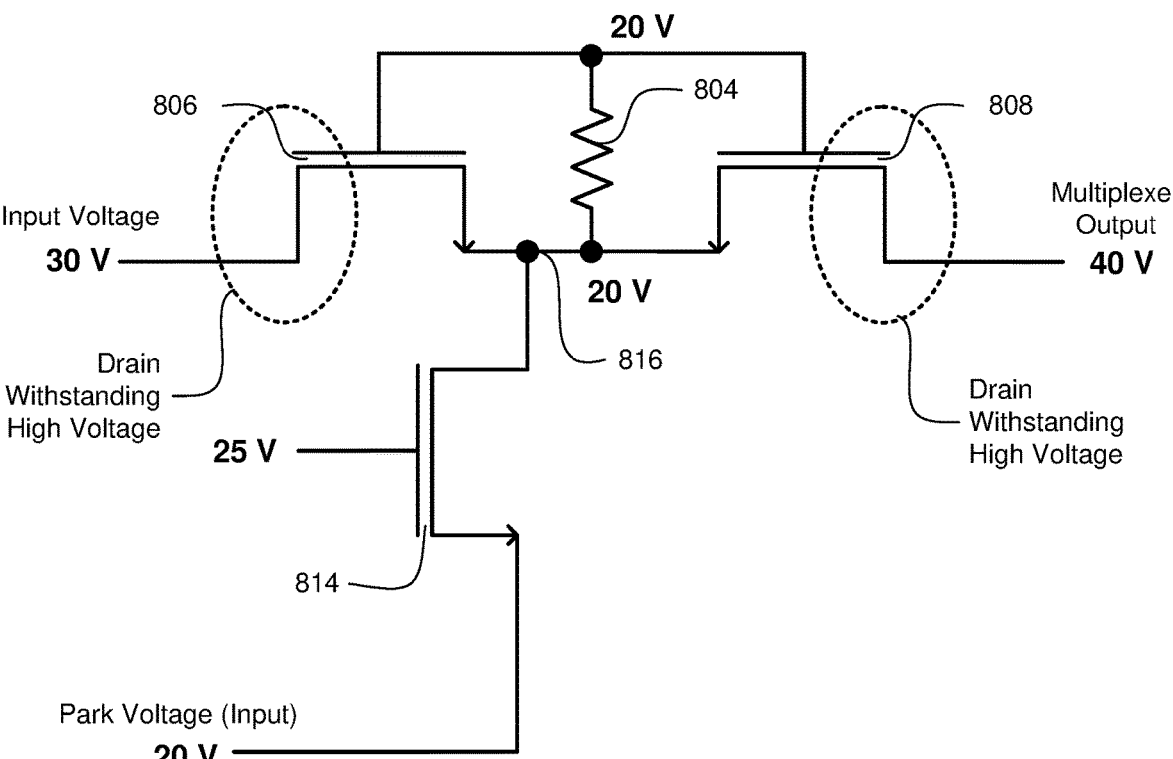
Figure 9:
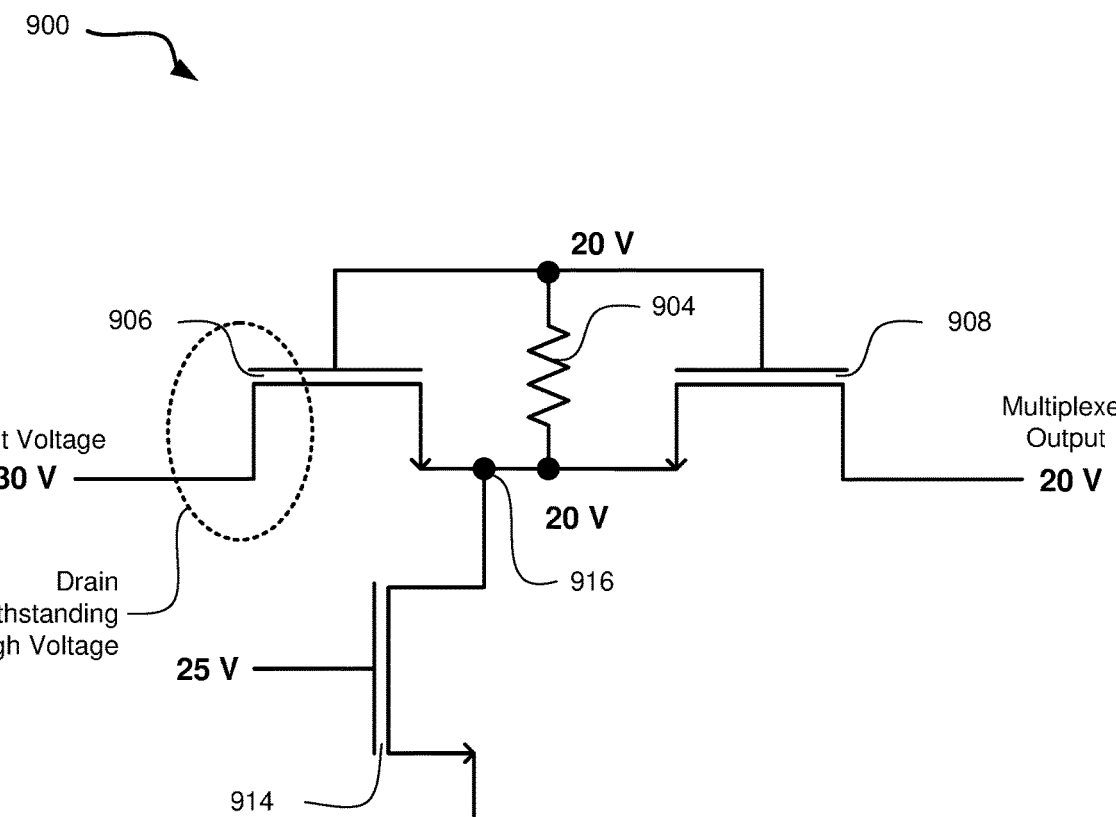
FIG. 9 is a schematic circuit diagram of a switch that includes a plurality of transistors configured to implement transistor voltage parking to reduce current leakage.
Figure 10:
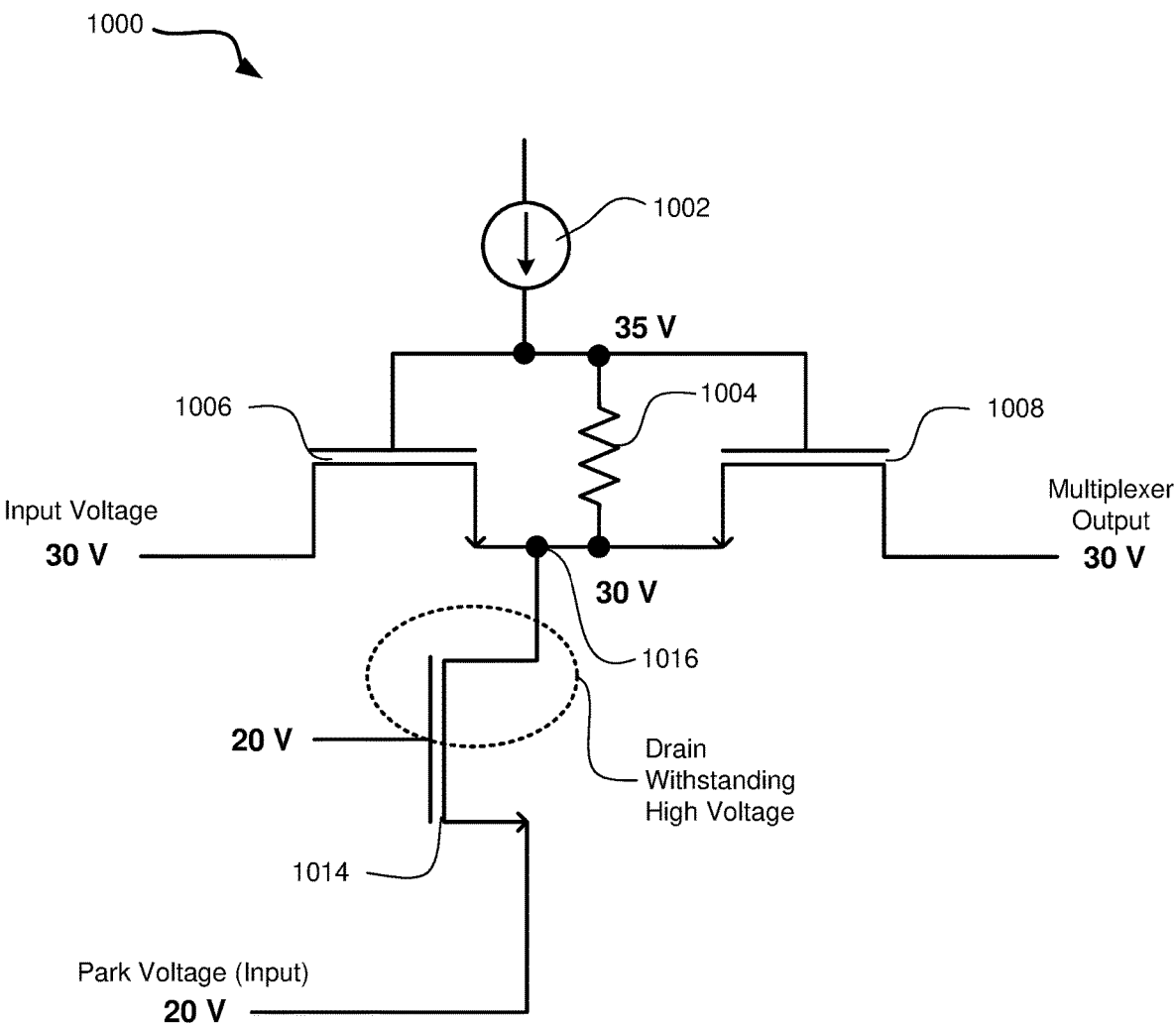
FIG. 10 is a schematic circuit diagram of a switch that includes a plurality of transistors configured to implement transistor voltage parking to reduce current leakage.

FIGS. 8-10 are schematic circuit diagrams each illustrating a switch that includes parking to prevent parasitic PNP leakage. FIG. 8 is a schematic circuit diagram of an exemplary switch 800 that could be implemented as a center switch in the multiplexers 300, 400 described herein. FIG. 9 is a schematic circuit diagram of an exemplary switch 900 that could be implemented as a center switch in the multiplexers 300, 400 described herein. FIG. 10 is a schematic circuit diagram of an exemplary switch 1000 that could be implemented as a center switch in the multiplexers 300, 400 described herein.

In FIG. 8, the switch 800 includes a source resistor 804, a left NMOS transistor 806, and a right NMOS transistor 808. The switch 800 additionally includes a common-source node 816 and a midpoint NMOS transistor 814 in electrical communication with the common-source node 816. The common-source node 816 is a point in the switch 800 where multiple components or signals share a common connection. Specifically, the left NMOS transistor 806 and the right NMOS transistor 808 share a common connection at the common-source node 816. The switch 800 includes a parasitic PNP transistor like the embodiments illustrated in FIGS. 6 and 7, but the switch 800 prevents the parasitic PNP transistor from turning on.

The switch 800 prevents the parasitic PNP transistor from turning on because the switch 800 includes the midpoint NMOS transistor 814 in electrical communication with the common-source node 816. Rather than allowing the common-source node 816 to float when the switch 800 is off, the parasitic PNP transistor is prevented from turning on by "parking" the midpoint NMOS transistor 814 to a low voltage. In the implementation illustrated in FIG. 8, the common-source node 816 is parked at 20 V. The midpoint NMOS transistor 814 is a switch that connects the park voltage input 20 V to the common-source node 816. The 25 V on the gate of the midpoint NMOS transistor 814 supplies the 5 V Vgs to turn on the midpoint NMOS transistor 814. By pulling the midpoint NMOS transistor 814 low, the source/body to drain/N-iso junctions of the left NMOS transistor 806 and the right NMOS transistor 808 are kept reverse-biased. This reduces or eliminates excess current flow.

In FIG. 8, the switch 800 is off, and the common-source node 816 is parked at 20 V. In this case, the switch 800 includes two input voltages, including the 30 V input voltage and the 20 V park voltage input. The switch includes one output voltage, namely the output voltage of 40 V from the right NMOS transistor 808. The drains of the left NMOS transistor 806 and the right NMOS transistor 808 are each withstanding high voltage.

In FIG. 9, the switch 900 includes a source resistor 904, a left NMOS transistor 906, and a right NMOS transistor 908. The switch 900 additionally includes a common-source node 916 and a midpoint NMOS transistor 914 in electrical communication with the common-source node 916. In the switch 900, the left NMOS transistor 906 and the right NMOS transistor 908 share a common connection at the common-source node 916. Notably, the switch 900 includes a parasitic PNP transistor (not shown), but the parasitic PNP is not on.

Like in the switch 800 illustrated in FIG. 8, the switch 900 prevents the parasitic PNP transistor from turning on because the switch 900 includes the midpoint NMOS transistor 914 in electrical communication with the common-source node 916. Rather than allowing the common-source node 916 to float when the switch 900 is off, the parasitic PNP transistor is prevented from turning on by "parking" the midpoint NMOS transistor 914 to a low voltage. In the implementation illustrated in FIG. 9, the midpoint NMOS transistor 914 is parked at 20 V. By pulling the midpoint NMOS transistor 914 low, the source/body to drain/N-iso junctions of the left NMOS transistor 906 and the right NMOS transistor 908 are kept reverse-biased. This reduces or eliminates excess current flow.

In FIG. 9, the switch 900 is off, and the midpoint NMOS transistor 914 is parked at 20 V. In this case, the switch 900 receives the input voltage of 30 V and the park voltage (also an input) of 20 V. The switch 900 outputs a multiplexer output voltage of 20 V from the right NMOS transistor 908. The drain of the left NMOS transistor 906 is withstanding high voltage.

In the switch 800 illustrated in FIG. 8, and further in the switch 900 illustrated in FIG. 9, the park voltage serves as an input. When the multiplexer switch is in an OFF state, the park transistor (i.e., the midpoint NMOS transistor 814 or the midpoint NMOS transistor 914) turns on. This pulls the midpoint (i.e., the common-source node 816 or common-source node 916) down to the park voltage input. In order for the parking function to work, the park voltage must be less than or equal to the lowest multiplexer input voltage. FIG. 8 illustrates an example wherein the park voltage (20 V) is less than the input voltage (30 V) and the multiplexer output (40 V). In this case, both the left NMOS transistor 806 and the right NMOS transistor 808 withstand high voltage from drain to source. FIG. 9 illustrates a different case, wherein the park voltage (20 V) is below the switch input voltage (30 V) but equal to the multiplexer output voltage (20 V). In this case, only the left NMOS transistor 906 withstands high drain-to-source voltage, because the multiplexer output (20 V) is equivalent to the park voltage (20 V).

In FIG. 10, the switch 1000 includes a source resistor 1004, a left NMOS transistor 1006, and a right NMOS transistor 1008. In contrast with the switches 800, 900 illustrated in FIGS. 8 and 9, the switch 1000 is turned on and additionally includes a gate 1002. The switch 1000 includes a common-source node 1016 and a midpoint NMOS transistor 1014 in electrical communication with the common-source node 1016. In the switch 1000, the left NMOS transistor 1006 and the right NMOS transistor 1008 share a common connection at the common-source node 1016.

In FIG. 10, the switch 1000 is on, and the midpoint NMOS transistor 1014 is not parked. The drain of the midpoint NMOS transistor 1014 is withstanding high voltage. As described herein, a drain withstands high voltage when the drain-to-source voltage is higher than the maximum allowed gate-to-source voltage. It is not necessary that the switch 1000 actually withstands high voltage, even though the switch 1000 is designed to withstand high voltage. In the example illustrated in FIG. 10, the park voltage is 20 V, the multiplexer output voltage is 30 V, and thus the midpoint NMOS transistor 1014 withstands high voltage. In an alternative exemplary implementation, if the park voltage was 20 V and the multiplexer output voltage was 25 V, then the midpoint NMOS transistor 1014 would not withstand high voltage, but the functionality of the switch 1000 would be the same.

EXAMPLES

The following examples pertain to further embodiments.

Example 1 is a switch. The switch includes a source resistor; a first transistor, wherein the first transistor is a metal-oxide-semiconductor field-effect (MOSFET) transistor; a second transistor, wherein the second transistor is a MOSFET transistor; and a midpoint transistor, wherein the midpoint transistor is a MOSFET transistor, and wherein the midpoint transistor is located in between the first transistor and the second transistor. The midpoint transistor is maintained at a low voltage in response to the switch being in a non-conductive state, and the low voltage is less than or equal to an output voltage of the switch.

Example 2 is a switch as in Example 1, wherein the first transistor comprises: a first gate; a first source terminal; and a first drain/N-iso terminal; and wherein the second transistor comprises: a second gate; a second source terminal; and a second drain/N-iso terminal.

Example 3 is a switch as in any of Examples 1-2, wherein, in response to the midpoint transistor maintaining the low voltage: a first junction from the first source terminal to the first drain/N-iso terminal of the first transistor is reverse biased; and a second junction from the second source terminal to the second drain/N-iso terminal of the second transistor is reverse biased.

Example 4 is a switch as in any of Examples 1-3, wherein the midpoint transistor is maintained at the low voltage to reduce excess current flow in the switch.

Example 5 is a switch as in any of Examples 1-4, wherein the switch comprises a multiplexer voltage output that is in direct electrical communication with the second transistor; and wherein the switch comprises two voltage inputs comprising: a first voltage input in direct electrical communication with the first transistor; and a midpoint voltage input in direct electrical communication with the midpoint transistor.

Example 6 is a switch as in any of Examples 1-5, wherein the midpoint voltage input comprises a midpoint voltage level; wherein the multiplexer output comprises a multiplexer voltage level; and wherein, in response to the midpoint transistor being maintained at the low voltage, the midpoint voltage level is less than the multiplexer voltage level.

Example 7 is a switch as in any of Examples 1-6, wherein the midpoint voltage input comprises a midpoint voltage level; wherein the multiplexer output comprises a multiplexer voltage level; and wherein, in response to the midpoint transistor being maintained at the low voltage, the midpoint voltage level is substantially equal to the multiplexer voltage level.

Example 8 is a switch as in any of Examples 1-7, wherein the midpoint transistor is not maintained at the low voltage in response to the switch being in a conductive state.

Example 9 is a switch as in any of Examples 1-8, wherein, in response to the switch being in the conductive state, the midpoint transistor withstands a high voltage drop, and wherein the high voltage drop is less than or equal to the output voltage of the switch.

Example 10 is a switch as in any of Examples 1-9, wherein, in response to the midpoint transistor being maintained at the low voltage, each of the first transistor and the second transistor withstands a high voltage drop, and wherein the high voltage drop is less than or equal to the output voltage of the switch.

Example 11 is a switch as in any of Examples 1-10, wherein, in response to the midpoint transistor being maintained at the low voltage, one of the first transistor or the second transistor withstands a high voltage drop, and wherein the high voltage drop is less than or equal to the output voltage of the switch.

Example 12 is a switch as in any of Examples 1-11, wherein at least one of the first transistor, the second transistor, or the midpoint transistor is an N-channel metal-oxide semiconductor (NMOS) transistor.

Example 13 is a switch as in any of Examples 1-12, wherein at least one of the first transistor, the second transistor, or the midpoint transistor is a double diffusion metal oxide semiconductor field-effect (DMOS FET) transistor.

Example 14 is a switch as in any of Examples 1-13, wherein maintaining the midpoint transistor at the low voltage substantially eliminates a parasitic positive-negative-positive (PNP) transistor occurring within either of the first transistor or the second transistor.

Example 15 is a switch as in any of Examples 1-14, wherein the switch is one of a plurality of switches in a multiplexer.

Example 16 is a switch as in any of Examples 1-15, wherein the plurality of switches of the multiplexer comprises: a first switch receiving a first input voltage; a second switch receiving a second input voltage; and a third switch receiving a third input voltage; wherein the first input voltage is greater than either of the second input voltage or the third input voltage; and wherein the second input voltage is greater than the third input voltage.

Example 17 is a switch as in any of Examples 1-16, wherein, in response to the first switch being in a conductive state and each of the second switch and the third switch being in the non-conductive state, an output voltage of the multiplexer is substantially equal to the first input voltage.

Example 18 is a switch as in any of Examples 1-17, wherein, in response to the third switch being in a conductive state and each of the first switch and the second switch being in the non-conductive state, an output voltage of the multiplexer is substantially equal to the third input voltage.

Example 19 is a switch as in any of Examples 1-18, wherein the multiplexer is a component of a battery management system.

Example 20 is a switch as in any of Examples 1-19, wherein the battery management system is configured to manage a plurality of batteries, and wherein a quantity of the plurality of batteries is evenly divisible by a quantity of the plurality of switches such that each of the plurality of switches is in electrical communication with a same number of batteries of the plurality of batteries.

Example 21 is a multiplexer. The multiplexer comprises a switch includes any of the characteristics of Examples 1-20.

Example 22 is a battery management system. The battery management system includes a switch comprising any of the characteristics of Examples 1-20.

The foregoing description has been presented for the purposes of illustration and description. It is not intended to be exhaustive or to limit the disclosure to the precise form disclosed. Many modifications and variations are possible considering the above teaching. Further, it should be noted that any or all the alternate implementations may be used in any combination desired to form additional hybrid implementations of the disclosure.

Further, although specific implementations of the disclosure have been described and illustrated, the disclosure is not to be limited to the specific forms or arrangements of parts so described and illustrated. The scope of the disclosure is to be defined by the claims appended hereto, if any, any future claims submitted here and in different applications, and their equivalents.

It is to be understood that any features of the above-described arrangements, examples, and embodiments may be combined in a single embodiment comprising a combination of features taken from any of the disclosed arrangements, examples, and embodiments.

It will be appreciated that various features disclosed herein provide significant advantages and advancements in the art. The following claims are exemplary of some of those features.

In the foregoing Detailed Description of the Disclosure, various features of the disclosure are grouped together in a single embodiment for the purpose of streamlining the disclosure. This method of disclosure is not to be interpreted as reflecting an intention that the claimed disclosure requires more features than are expressly recited in each claim. Rather, inventive aspects lie in less than all features of a single foregoing disclosed embodiment.

It is to be understood that the above-described arrangements are only illustrative of the application of the principles of the disclosure. Numerous modifications and alternative arrangements may be devised by those skilled in the art without departing from the spirit and scope of the disclosure and the appended claims are intended to cover such modifications and arrangements. Thus, while the disclosure has been shown in the drawings and described above with particularity and detail, it will be apparent to those of ordinary skill in the art that numerous modifications, including, but not limited to, variations in size, materials, shape, form, function and manner of operation, assembly and use may be made without departing from the principles and concepts set forth herein.

The foregoing description has been presented for the purposes of illustration and description. It is not intended to be exhaustive or to limit the disclosure to the precise form disclosed. Many modifications and variations are possible considering the above teaching. Further, it should be noted that any or all the alternate implementations may be used in any combination desired to form additional hybrid implementations of the disclosure.

Further, although specific implementations of the disclosure have been described and illustrated, the disclosure is not to be limited to the specific forms or arrangements of parts so described and illustrated. The scope of the disclosure is to be defined by the claims appended hereto, any future claims submitted here and in different applications, and their equivalents.

What is claimed is:

1. A switch comprising:
a source resistor;
a first transistor, wherein the first transistor is a metal-oxide-semiconductor field-effect (MOSFET) transistor;
a second transistor, wherein the second transistor is a MOSFET transistor; and
a midpoint transistor, wherein the midpoint transistor is a MOSFET transistor, and wherein the midpoint transistor is located in between the first transistor and the second transistor;
wherein the midpoint transistor is maintained at a low voltage in response to the switch being in a non-conductive state; and
wherein the low voltage is less than or equal to an output voltage of the switch;
wherein the first transistor comprises:
a first gate;
a first source terminal; and
a first drain/N-iso terminal; and
wherein the second transistor comprises:
a second gate;
a second source terminal; and
a second drain/N-iso terminal.

2. The switch of claim 1, wherein, in response to the midpoint transistor maintaining the low voltage:
a first junction from the first source terminal to the first drain/N-iso terminal of the first transistor is reverse biased; and
a second junction from the second source terminal to the second drain/N-iso terminal of the second transistor is reverse biased.

3. The switch of claim 1, wherein the midpoint transistor is maintained at the low voltage to reduce excess current flow in the switch.

4. The switch of claim 1, wherein the switch comprises a multiplexer voltage output that is in direct electrical communication with the second transistor; and
wherein the switch comprises two voltage inputs comprising:
a first voltage input in direct electrical communication with the first transistor; and
a midpoint voltage input in direct electrical communication with the midpoint transistor.

5. The switch of claim 4, wherein the midpoint voltage input comprises a midpoint voltage level;
wherein the multiplexer output comprises a multiplexer voltage level; and
wherein, in response to the midpoint transistor being maintained at the low voltage, the midpoint voltage level is less than the multiplexer voltage level.

6. The switch of claim 4, wherein the midpoint voltage input comprises a midpoint voltage level;
wherein the multiplexer output comprises a multiplexer voltage level; and
wherein, in response to the midpoint transistor being maintained at the low voltage, the midpoint voltage level is substantially equal to the multiplexer voltage level.

7. The switch of claim 1, wherein the midpoint transistor is not maintained at the low voltage in response to the switch being in a conductive state.

8. The switch of claim 7, wherein, in response to the switch being in the conductive state, the midpoint transistor withstands a high voltage drop, and wherein the high voltage drop is less than or equal to the output voltage of the switch.

9. The switch of claim 1, wherein, in response to the midpoint transistor being maintained at the low voltage, each of the first transistor and the second transistor withstands a high voltage drop, and wherein the high voltage drop is less than or equal to the output voltage of the switch.

10. The switch of claim 1, wherein, in response to the midpoint transistor being maintained at the low voltage, one of the first transistor or the second transistor withstands a high voltage drop, and wherein the high voltage drop is less than or equal to the output voltage of the switch.

11. The switch of claim 1, wherein at least one of the first transistor, the second transistor, or the midpoint transistor is an N-channel metal-oxide semiconductor (NMOS) transistor.

12. The switch of claim 1, wherein at least one of the first transistor, the second transistor, or the midpoint transistor is a double diffusion metal oxide semiconductor field-effect (DMOS FET) transistor.

13. The switch of claim 1, wherein maintaining the midpoint transistor at the low voltage prevents activation of a parasitic positive-negative-positive (PNP) transistor within either of the first transistor or the second transistor.

14. The switch of claim 1, wherein the switch is one of a plurality of switches in a multiplexer.

15. The switch of claim 14, wherein the plurality of switches of the multiplexer comprises:
a first switch receiving a first input voltage;
a second switch receiving a second input voltage; and
a third switch receiving a third input voltage;
wherein the first input voltage is greater than either of the second input voltage or the third input voltage; and
wherein the second input voltage is greater than the third input voltage.

16. The switch of claim 15, wherein, in response to the first switch being in a conductive state and each of the second switch and the third switch being in the non-conductive state, an output voltage of the multiplexer is substantially equal to the first input voltage.

17. The switch of claim 15, wherein, in response to the third switch being in a conductive state and each of the first switch and the second switch being in the non-conductive state, an output voltage of the multiplexer is substantially equal to the third input voltage.

18. The switch of claim 15, wherein the multiplexer is a component of a battery management system.

19. The switch of claim 18, wherein the battery management system is configured to manage a plurality of batteries, and wherein a quantity of the plurality of batteries is evenly divisible by a quantity of the plurality of switches such that each of the plurality of switches is in electrical communication with a same number of batteries of the plurality of batteries.

20. A switch comprising:
a source resistor;
a first transistor, wherein the first transistor is a metal-oxide-semiconductor field-effect (MOSFET) transistor;
a second transistor, wherein the second transistor is a MOSFET transistor; and
a midpoint transistor, wherein the midpoint transistor is a MOSFET transistor, and wherein the midpoint transistor is located in between the first transistor and the second transistor;
wherein the midpoint transistor is maintained at a low voltage in response to the switch being in a non-conductive state; and
wherein the low voltage is less than or equal to an output voltage of the switch;
wherein the switch comprises a multiplexer voltage output that is in direct electrical communication with the second transistor; and
wherein the switch comprises two voltage inputs comprising:
a first voltage input in direct electrical communication with the first transistor; and
a midpoint voltage input in direct electrical communication with the midpoint transistor.

21. A switch comprising:
a source resistor;
a first transistor, wherein the first transistor is a metal-oxide-semiconductor field-effect (MOSFET) transistor;
a second transistor, wherein the second transistor is a MOSFET transistor; and
a midpoint transistor, wherein the midpoint transistor is a MOSFET transistor, and wherein the midpoint transistor is located in between the first transistor and the second transistor;
wherein the midpoint transistor is maintained at a low voltage in response to the switch being in a non-conductive state; and
wherein the low voltage is less than or equal to an output voltage of the switch;
wherein maintaining the midpoint transistor at the low voltage prevents activation of a parasitic positive-negative-positive (PNP) transistor within either of the first transistor or the second transistor.

* * * * *